United States Patent [19]

Berry et al.

[11] Patent Number: 5,091,693

[45] Date of Patent: Feb. 25, 1992

[54] DUAL-SIDED TEST HEAD HAVING FLOATING CONTACT SURFACES

[75] Inventors: Tommie Berry, Morgan Hill; Larry Delaney, Fremont; Rudy H. Staffelbach, Santa Clara, all of Calif.

[73] Assignee: Schlumberger Technologies, Inc., San Jose, Calif.

[21] Appl. No.: 553,202

[22] Filed: Jul. 13, 1990

[51] Int. Cl.⁵ .................... G01R 31/02; G01R 1/73
[52] U.S. Cl. ............................ 324/158 F; 324/158 P
[58] Field of Search ............... 324/158 F, 158 P, 72.5, 324/158 R, 73.1, 500, 537; 439/482; 371/27, 22.6

[56] References Cited

U.S. PATENT DOCUMENTS

| | | | |
|---|---|---|---|
| 3,848,188 | 11/1974 | Ardezzone et al. | 371/27 |
| 4,012,625 | 3/1977 | Bowen et al. | 371/22.6 |
| 4,227,149 | 10/1980 | Faure et al. | 324/158 F |
| 4,362,991 | 12/1982 | Carbine | 324/158 F |
| 4,471,298 | 9/1984 | Frohlich | 324/158 F |
| 4,506,213 | 3/1985 | O'Connor | 324/158 F |
| 4,527,119 | 7/1985 | Rogers et al. | 324/158 F |

FOREIGN PATENT DOCUMENTS

| | | | |
|---|---|---|---|
| 0244637 | 10/1988 | Japan | 324/158 P |
| 2136138 | 9/1984 | United Kingdom | 324/158 P |

Primary Examiner—Kenneth A. Wieder
Assistant Examiner—Vinh P. Nguyen
Attorney, Agent, or Firm—Steven P. Koda

[57] ABSTRACT

A dual-sided test head for an integrated circuit test system. Each side of the test head has a floating contact surface which provides an electrical contact interface between one side of the test head and a respective load board. Each load board is part of a respective integrated circuit handling system. As the test head has two sides and a load board is contacted at each side, the floating contact surfaces facilitate docking of the test head to the respective load boards. The contactors are floating so as to have freedom of motion to rotate, tilt, offset laterally or offset vertically, relative to the test head.

20 Claims, 6 Drawing Sheets

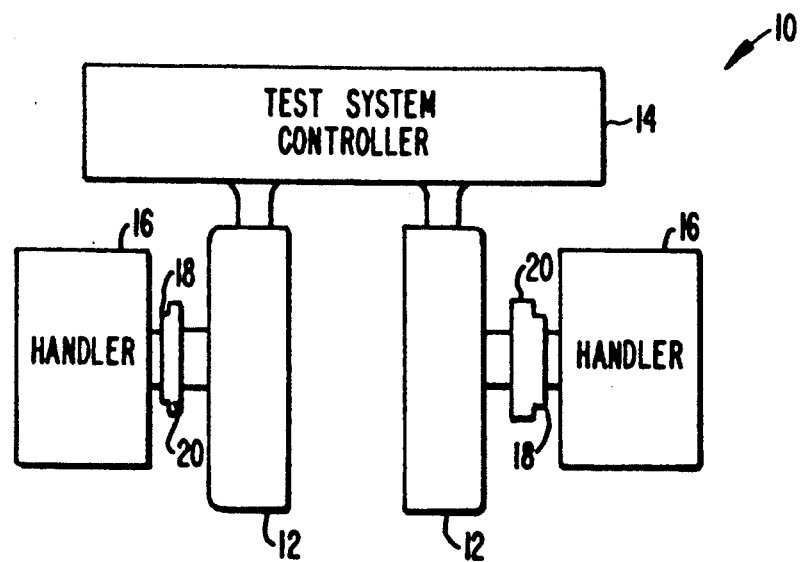
FIG._1. (PRIOR ART)
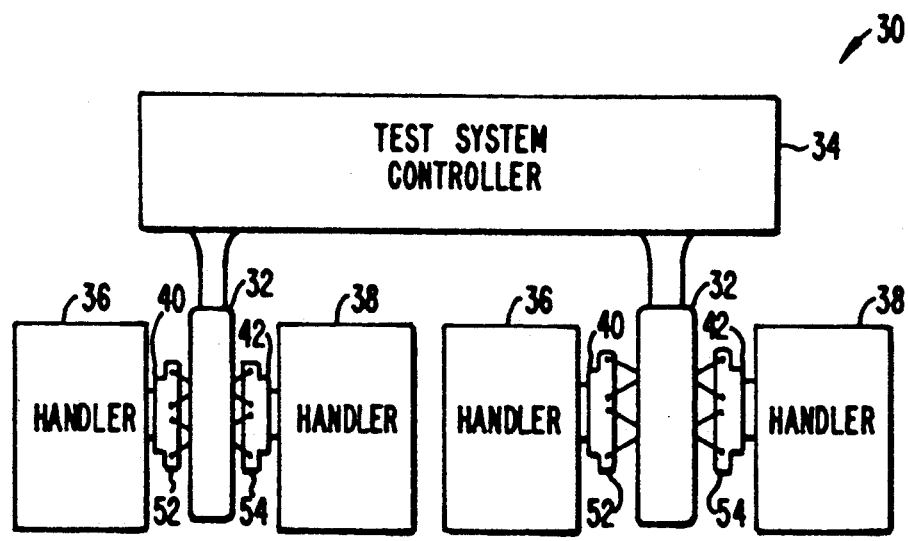
FIG._2.

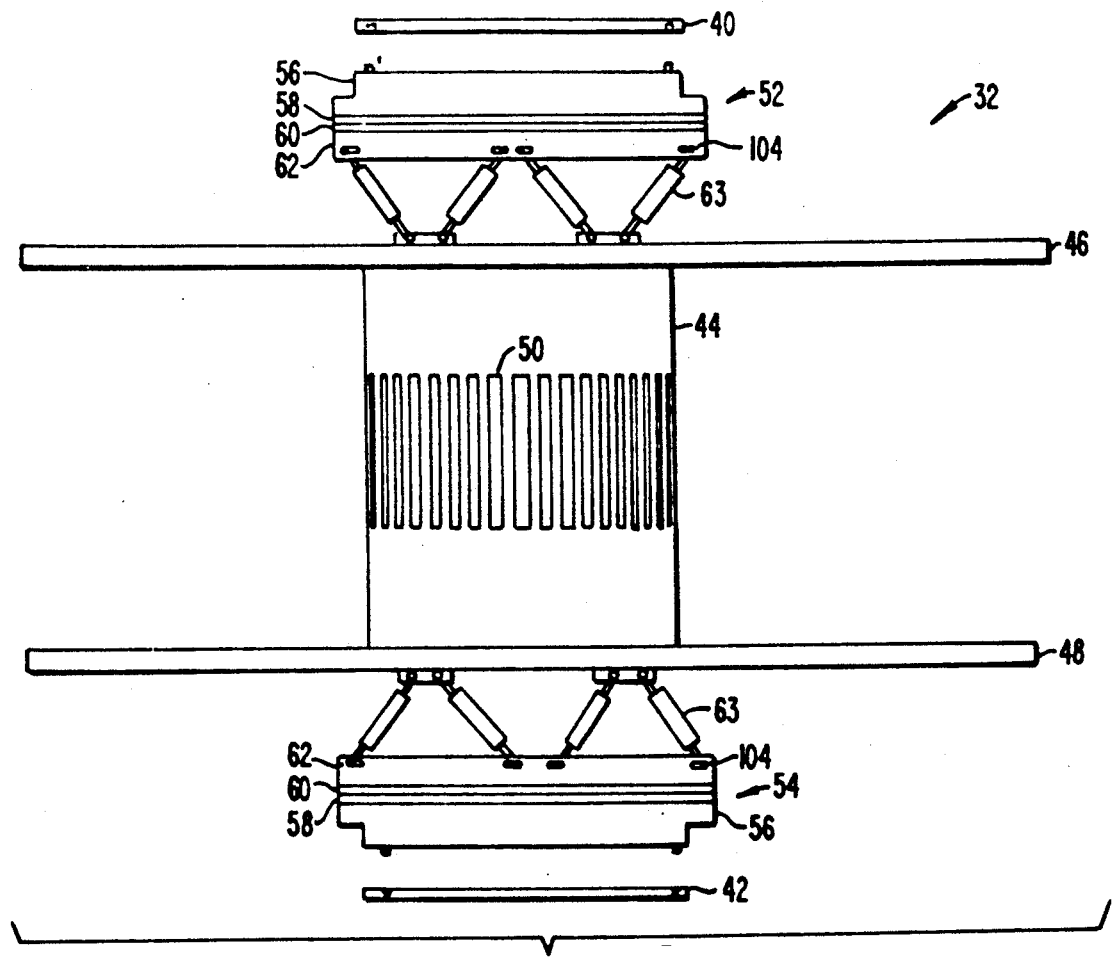
FIG._3.
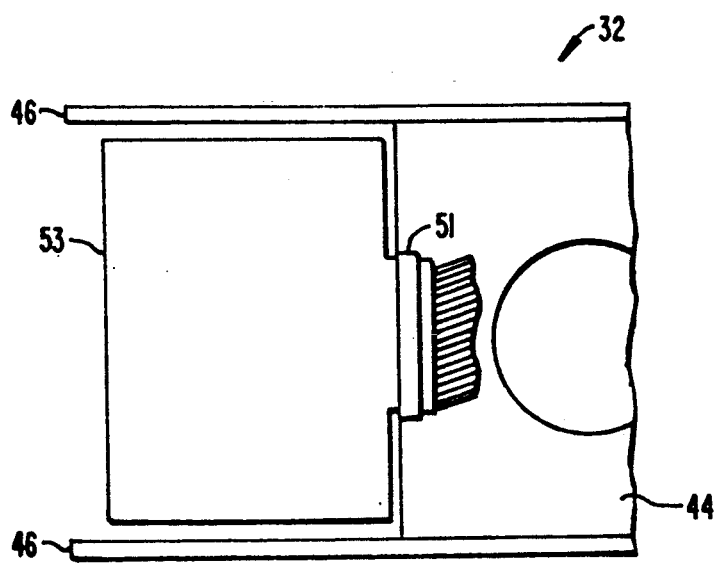
FIG._4.

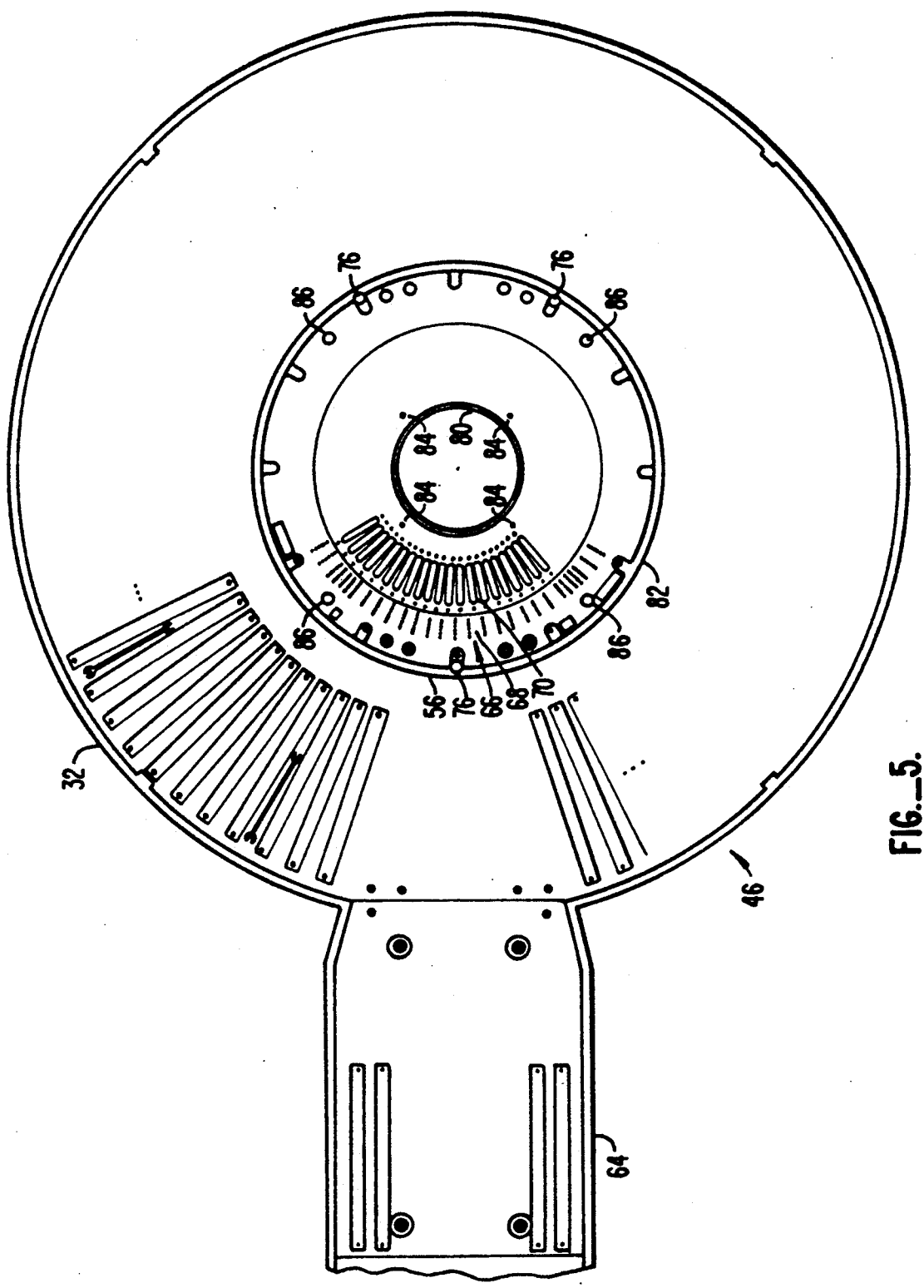

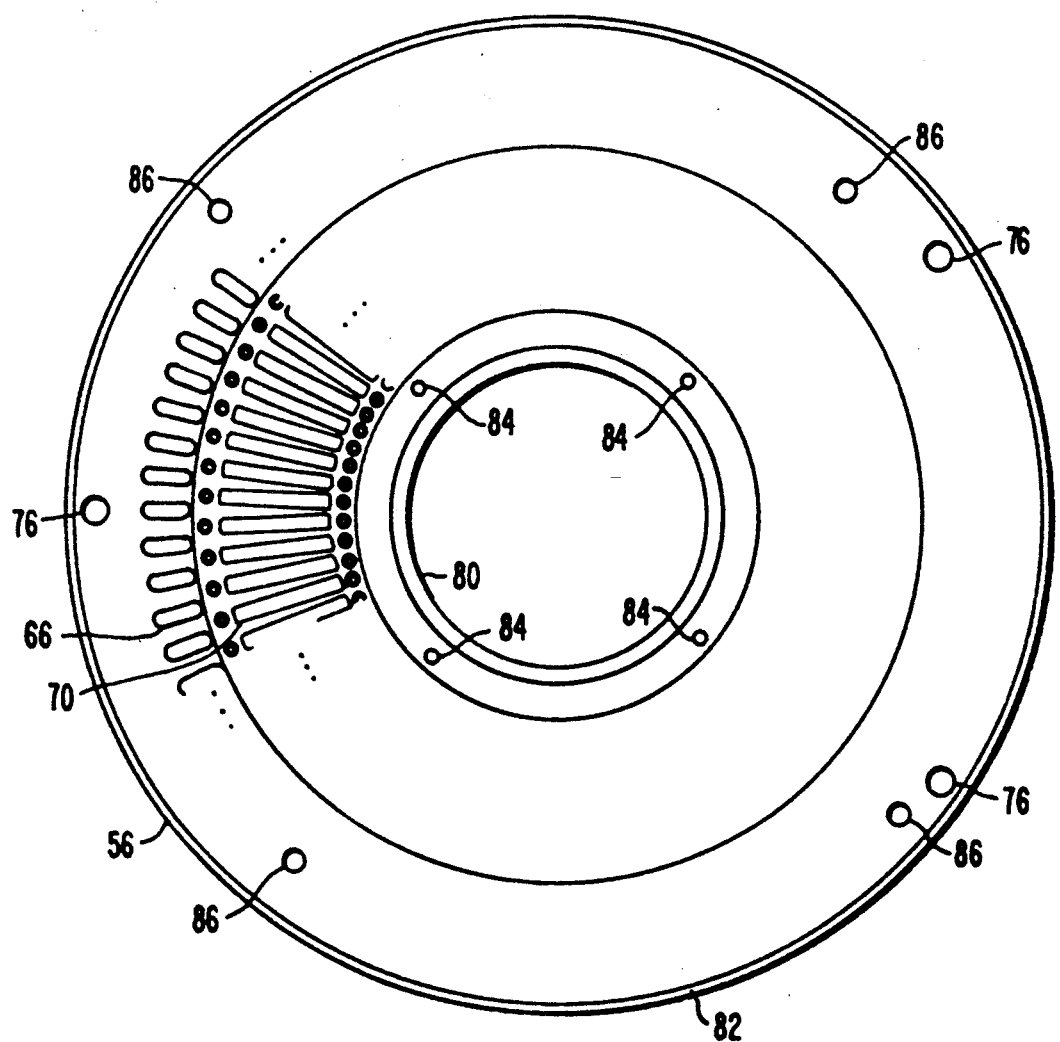
FIG._6.

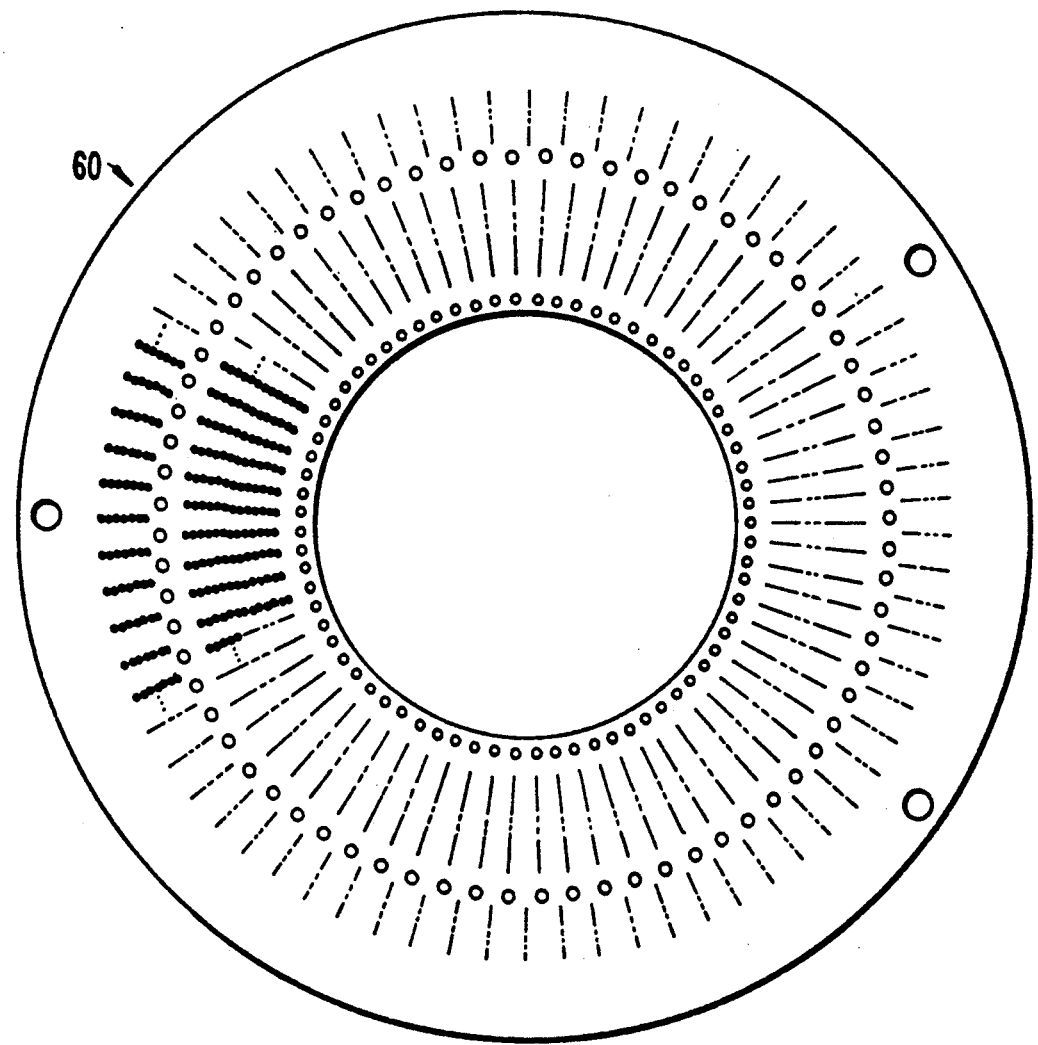
FIG._7.
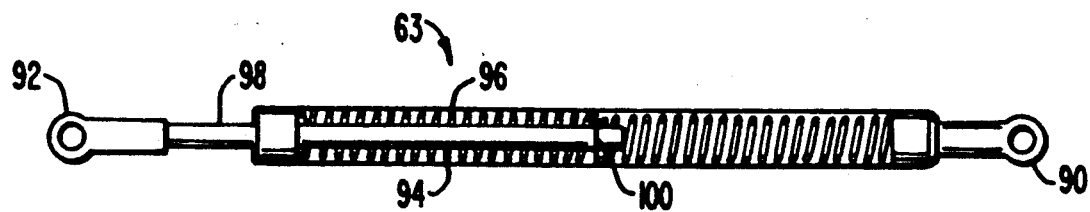
FIG._8.

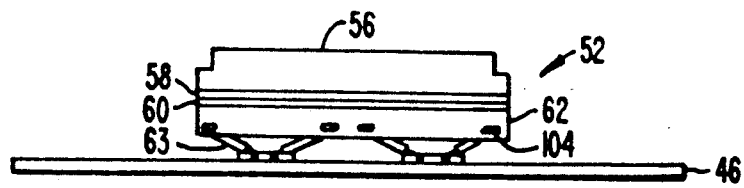
FIG._9.
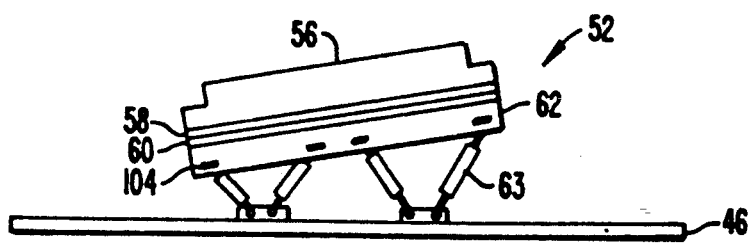
FIG._10.
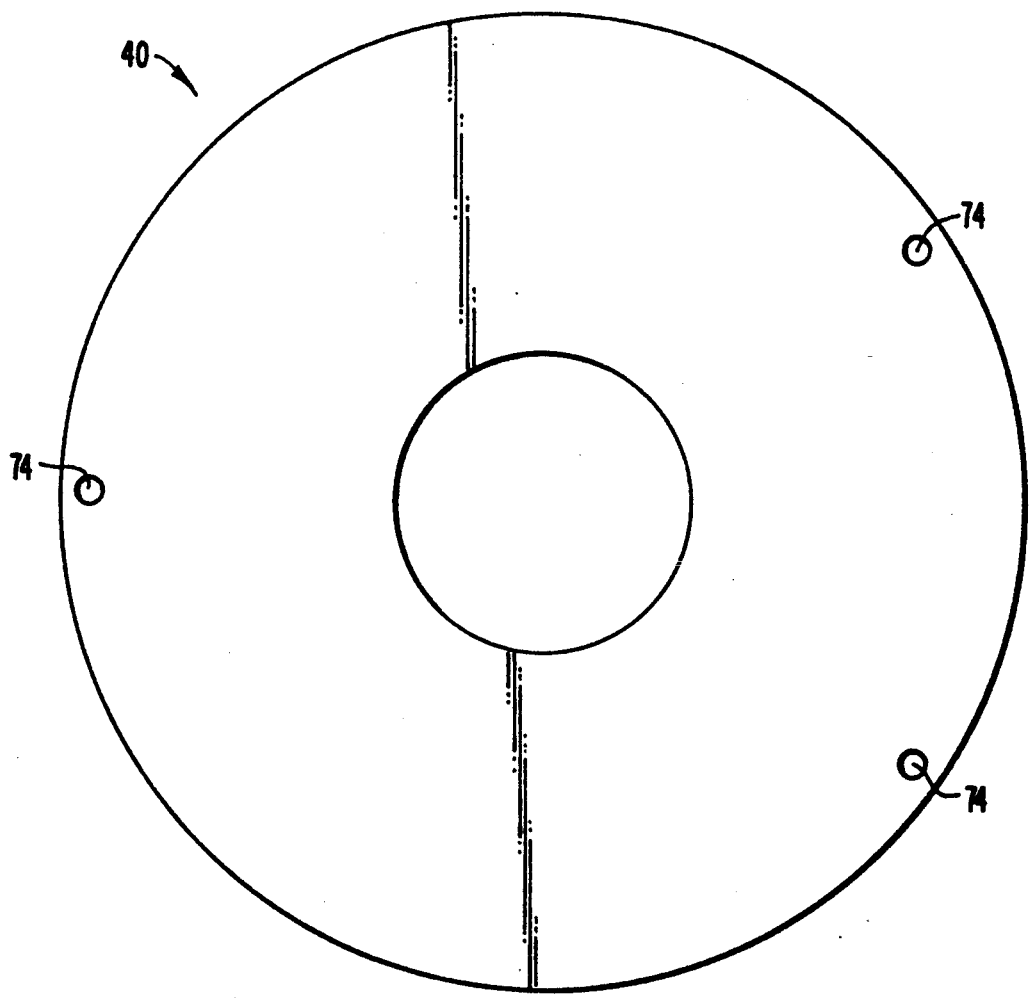
FIG._11.

DUAL-SIDED TEST HEAD HAVING FLOATING CONTACT SURFACES

BACKGROUND OF THE INVENTION

This invention relates to a test head having a contact apparatus which engages an integrated circuit load board. More particularly, this invention relates to a dual-sided test head and to a floating contact surface at each side for facilitating engagement between the test head and respective load boards.

A conventional integrated circuit test system 10 is shown in FIG. 1 to include one or more test heads 12 coupled to a test system controller 14. Each test head 12 engages a single handler 16 at a load board 18. The load board 18 supports an integrated circuit device to be tested. Because the conventional test heads engage only one load board at a time, there is a great deal of down time between tests as the handler 16 repositions the load board 18 to test another integrated circuit. Accordingly, there is a need for increasing the up-time, i.e. throughput, of the test system.

One approach for increasing the system throughput is to reduce the time needed to dock the test head 12 to a handler 16. Conventional test heads 12 include a contact surface 20 which may rotate a few degrees about its center in the plane of the contactor 20 while being fixed so as to prevent movement in all other directions. As a result, substantially all the manipulation needed for docking to a handler 16 is done by manipulating the test head 12. This technique has been satisfactory for test heads with up to 256 pins. However, for test heads having 512 pins or more, the head becomes too clumsy and too heavy to manipulate freely. Accordingly, the docking time increases unsatisfactorily.

One approach for decreasing the docking time has been to provide automated manipulating devices which automate the docking process. To achieve reasonable docking times, however, the manipulator must be able to move the test head with precision within tight tolerances. Such an approach is an expensive solution. An effective less expensive solution for decreasing the docking time and increasing the system throughput is needed.

SUMMARY OF THE INVENTION

According to one aspect of the invention a dual-sided test head is provided. An advantage of the dual-sided test head is that the down time between tests is shortened as an integrated circuit at one side of the head may be tested while the handler at the opposite side repositions the integrated circuit wafer for a subsequent test.

According to another aspect of the invention a floating contact apparatus is provided at each side of the test head. One advantage of the floating contact is that the requisite manipulator tolerances may be relaxed enabling a less expensive solution for shortening the docking time. The contact is floated by a suspension system which enables the contact freedom of motion to rotate, to offset within its plane, to offset parallel to its initial plane and to angle relative to its initial plane.

A further understanding of the nature and advantages of the invention may be realized by reference to the remaining portions of the specification and the drawings.

BRIEF DESCRIPTION OF THE DRAWINGS

FIG. 1 is a block diagram of a conventional test system;

FIG. 2 is a block diagram of a test system embodying a dual-sided head and floating contact apparatus according to an embodiment of this invention;

FIG. is a cut-away view of a dual-sided test head according to an embodiment of this invention;

FIG. 4 is a partial cut-away view of the dual-sided test head of FIG. 3;

FIG. 5 is a top view of the test head of FIG. 3 having a floating contact apparatus according to an embodiment of this invention;

FIGS. 6 is a top view of the contactor plate according to the embodiment of FIG. 5;

FIG. 7 is a top view of the interface pc board between the contactor plate and the contactor support ring according to the embodiment of FIG. 5;

FIG. 8 is a plan view of a spring suspensor for floating the contactor plate;

FIG. 9 is a block diagram showing the contactor in a compressed position;

FIG. 10 is a block diagram showing the contactor in a tilted position; and

FIG. 11 is a plan view of a load board.

DETAILED DESCRIPTION OF A PREFERRED EMBODIMENT

Referring to FIG. 2, a block diagram of a test system 30 having a pair of dual-sided test heads 32 is shown. A test system controller 34 provides the system control for manipulating each test head 32 to dock to a respective pair of handlers 36, 38. Respective load boards 40, 42 are positioned at the respective handlers 36, 38. Typically, a respective semiconductor wafer, including a plurality of integrated circuit (IC) devices to be tested, is connected to a respective load board 40, 42. In operation, an integrated circuit device on a wafer coupled to one load board 40 is tested, while the another wafer at the opposite load board 42 is repositioned. The respective handlers 36, 38 position the respective load boards 40, 42 to test the appropriate IC device. Thus, while one side of the test head is down, the other side of the test head may be in operation. Accordingly, the system 30 down time is decreased, thereby increasing the system throughput.

Referring to FIGS. 3 and 4, the dual-sided test head 32 is shown having a central hollow cylindrical drum shell 44 and two outer plate assemblies 46, 48. The plate assemblies 46, 48 are located at the respective ends of the drum 44 and form the respective sides of the dual-sided test head 32. The drum 44 includes a plurality of aligned longitudinal openings 50 evenly spaced about its circumference. Each opening is for housing a connector 51 (FIG. 4) which receives a respective test circuit card 53. The test circuit cards 53 are fastened in place between the plates 46, 48 extending radially inward to the respective opening 50.

Fitted to one plate assembly 46 is a contactor assembly 52. Fitted to the other plate assembly 48 is another contactor assembly 54. Each contactor assembly 52, 54 includes a contactor plate 56, a spacer 58, a contactor circuit card 60 and a support ring 62. A system of spring suspensors 63 are connected between the support ring 62 and a plate assembly 46, 48 for floating the contactor plate 56 position relative to the test head 32.

Referring to FIG. 5, a top view of the test head 32 is shown revealing one of the dual sides, including the test head plate assembly 46 and contactor plate 56. The arm structure 64 leading toward the plate assembly 46 connects to the central cylindrical drum shell 44 (FIG. 3). The electrical wiring from the system controller 34 (FIG. 2) passes through the arm 64 into the shell 44 to the test cards located about the periphery of the shell 44. Electrical coupling between the test cards and the contactor plates 56, 58 is achieved through respective contactor circuit cards 60.

Referring to FIGS. 5 and 6, the contactor plate 56 is shown to be an annular ring. The ring is thinner at the outer diameter than at the inner diameter. At the thicker portion two concentric rings of receptacles are formed. The outer ring of receptacles includes a plurality of power line contact receptacles 66. Each receptacle 66 extends radially inward and is for receiving a set of power line contacts 68. The inner ring of receptacles includes a plurality of test point contact receptacles 70. Each receptacle 70 extends radially inward and receives either a set of test point contacts or a filler. The filler seals the receptacle in the absence of test point contacts. The test point contacts provide the electrical contact between the test head 32 and a load board 40 or 42. The test head 32 is docked into physical contact with the load boards 40, 42 such that the contactor plates 56 of respective contactors 52, 54 are generally parallel to and engaging the respective load boards 40, 42.

Referring to FIG. 7, the contactor circuit board 60 is shown. The test point receptacles 70 and contacts therein of contactor plate 56 are mounted thereon to form an electrical contact with the contactor circuit board 60. Similarly, the power line contacts 68 also are mounted to the contactor plate 6 to form an electrical contact with the contactor circuit card 60. The circuit card 60 is coupled to the test cards 53 through internal wiring and the test card connectors 51 to establish an electrical circuit from the system controller 34 to the contactor plate 56.

Referring to FIG. 8, a spring suspensor 63 is shown. A suspension system including eight suspensors 63 connected between the support ring 62 and respecter plate assemblies 46, 48 floats the contactor plate 56 position relative to the test head 32 enabling the contactor plate 56 freedom of motion to compress, extend, tilt or offset. Each suspensor 63 includes connectors 90 and 92 for mechanical coupling to a plate assembly 46, 48 and support ring 62, respectively. Connector 92 includes an extended shaft 94 received into a cylinder 96 which houses a spring 98. The shaft 94 is coupled to an E-ring 100 which maintains the shaft 94 within the cylinder 96 during relative movement of the shaft 94. The connector 90 is shown anchored to the cylinder 96, but alternatively may include a shaft and move, like shaft 94 relative to the cylinder 96.

Referring to FIGS. 9 and 10, the contactor assembly 52 (54) is shown compressed and angled, respectively. Preferably, the contactor assembly 52 (54) may be moved at a vertical offset of plus or minus one-quarter inch to achieve expansion and compression, respectively. By compressing suspensors 63 at one side, the contactor assembly 52 (54) may be tilted or angled. Lateral offset of the contactor assembly 52 (54) is achieved by simultaneous compression of some suspensors and extension of other suspensors. Preferably a lateral offset of plus or minus one-quarter inch may be achieved.

Referring again to FIG. 3, the connection between a spring suspensor 63 and contactor support ring 62 is shown. The connector 92 as shown may move within a slot 104 on the ring 62. As a slot 104 is provided for each suspensor 63, the contactor assembly 52 (54) may rotate relative to the respective plate assembly 46 (48). Preferably the contactor assembly 52 may rotate up to 7 degrees.

Accordingly, the contactor assembly has freedom of motion to rotate, offset, compress, expand and tilt. According to the preferred embodiment, any point on the contactor plate 56 may be moved relative to an initial position to a new position by plus or minus one quarter inch in any direction. The maximum change in position may vary in various embodiments, although plus or minus one quarter inch has proved to be sufficient for achieving an acceptable docking time.

Referring to FIG. 11, a sample load board 40 is shown. The load board 40 includes a set of alignment holes 74 for receiving alignment posts 76 mounted to the contactor plate 56. During docking of the test head 32 to the load board 40, the posts 76 and holes 74 are mated.

Docking is completed by securing the load board 40 to the contactor plate 56. Referring again to FIGS. 5 and 6, the contactor plate 56 includes a pair of concentric rubber seal rings 80, 82. Four openings 84 are formed on the contactor plate 56 near the inner seal ring 80 and between the two rings 80, 82. Another four openings 86 are formed on the contactor plate 56 near the outer seal ring 82 between the seal rings 80, 82. The openings 84, 86 receive vacuum lines connected to a suction pump or the like. In operation, the pump creates a suction force between the contactor plate 56 and load board 40 within the annular ring defined between the inner and outer seal rings 80, 82. Accordingly, the load board 40 is held in contact with the contactor plate 56 by a suction force. During normal operation of the test system 30, docking is achieved at load boards 40 and 42 of handlers 36 and 38, respectively, using a manipulator (part of controller 34) to move the test head 32. To enable docking to both load boards 40, 42, the contactor assemblies 52, 54 are floating. The floating nature eases the tolerance requirements on the control of the manipulator's movements.

Once the test head 32 is docked to both load boards, the handler 36 positions an integrated circuit for testing. Similarly, the handler 38 also positions an integrated circuit for testing. As described, these integrated circuits, typically, are part of a semiconductor wafer of several integrated circuits to be tested. The controller 34 will test the IC at load board 40. When complete, the controller will test the IC at load board 42. While the IC at load board 42 is being tested, the handler 36 repositions the semiconductor at load board 40 to select another IC. Once the controller 34 finishes testing the IC at load board 42, it tests the selected IC of load board 40. During this time, the handler 38 repositions the semiconductor wafer at load board 42 to select another IC. By flipping back and forth from testing at one side of the head 32 to the other, the system throughput is increased. By floating the contactor assemblies 52, 54, docking at both sides of the test head 32 is possible within acceptable docking times.

Although a preferred embodiment of the invention has been illustrated and described, various alternatives, modifications and equivalents may be used. For example, the load board 40 alternatively may be held to the contactor plate 56 by disengageable fasteners, magnetic attraction, or opposing forces. Therefore, the foregoing description should not be taken as limiting the scope of the invention which is defined by the appended claims.

What is claimed is:

1. A test head for an integrated circuit test system which tests an integrated circuit device coupled to a load board, the test head comprising:
   a contactor having a first surface and a plurality of contacts, the plurality of contacts being fixedly positioned relative to said first surface, said plurality of contacts for providing an electrical interface between the test head and the load board;
   means supporting said contactor for enabling the first surface of the contactor freedom of motion to move with plural degree of freedom so as to move within a first plane defined by the contactor relative to a reference plane and to move out of said first plane; and
   means for holding said plurality of contacts and said load board in physical contact to maintain said electrical interface.

2. The test head of claim 1 in which said contactor may be tilted in any direction by three degrees.

3. The test head of claim 1 in which said contactor may move out of said first plane plus or minus one-quarter inch parallel to said first plane.

4. A test head for an integrated circuit test system which tests an integrated circuit device coupled to a load board, the test head comprising:
   a contactor having a first surface and a plurality of contacts positioned at said first surface, said plurality of contacts for providing an electrical interface between the test head and the load board;
   means supporting said contactor for enabling the contactor freedom of motion to move with plural degrees of freedom so as to move within a first plane defined by the contactor relative to the test head and to move out of said first plane; and
   means for holding said plurality of contacts and said load board in physical contact to maintain said electrical interface;
   wherein said supporting means enables the contactor freedom of motion relative to said test head to rotate, tilt, offset laterally and offset vertically.

5. A test head for an integrated circuit test system which tests an integrated circuit device coupled to a load board, the test head comprising:
   a contactor having a first surface and a plurality of contacts positioned at said first surface, said plurality of contacts for providing an electrical interface between the test head and the load board;
   means supporting said contactor for enabling the contactor freedom of motion to move with plural degrees of freedom so as to move within a first plane defined by the contactor relative to the test head and to move out of said first plane; and
   means for holding said plurality of contacts and said load board in physical contact to maintain said electrical interface;
   wherein said test head has two sides, a respective contactor and a respective supporting means being positioned on each side of the test head to provide an interface to a respective load board at each side of said test head, the pair of supporting means enabling the respective contactors freedom of motion to facilitate simultaneous contact between a load board and a contactor on each side, respectively.

6. A test head for an integrated circuit test system which tests an integrated circuit device coupled to a load board, the test head comprising:
   a contactor having a first surface and a plurality of contacts positioned at said first surface, said plurality of contacts for providing an electrical interface between the test head and the load board;
   means supporting said contactor for enabling the contactor freedom of motion to move with plural degrees of freedom so as to move within a first plane defined by the contactor relative to the test head and to move out of said first plane; and
   means for holding said plurality of contacts and said load board in physical contact to maintain said electrical interface;
   wherein said supporting means comprises a plurality of spring suspensors.

7. A test head for an integrated circuit test system which tests an integrated circuit device coupled to a load board, the test head comprising:
   a contactor having a first surface and a plurality of contacts positioned at said first surface, said plurality of contacts for providing an electrical interface between the test head and the load board;
   means supporting said contactor for enabling the contactor freedom of motion to move with plural degrees of freedom so as to move within a first plane defined by the contactor relative to the test head and to move cut of said first plane; and
   means for holding said plurality of contacts and said load board in physical contact to maintain said electrical interface;
   wherein said supporting means allows the contactor freedom of motion to move such that a point on said contactor is movable within the bounds of a one-half inch diameter sphere centered at said point.

8. A test head for an integrated circuit test system which tests an integrated circuit device coupled to a load board, the test head comprising:
   a contactor having a first surface and a plurality of contacts positioned at said first surface, said plurality of contacts for providing an electrical interface between the test head and the load board;
   means supporting said contactor for enabling the contactor freedom of motion to move with plural degrees of freedom so as to move within a first plane defined by the contactor relative to the test head and to move out of said first plane; and
   means for holding said plurality of contacts and said load board in physical contact to maintain said electrical interface;
   wherein said contactor may rotate within a seven angle of rotation.

9. A test head for an integrated circuit test system which tests an integrated circuit device coupled to a load board, the test head comprising:
   a contactor having a first surface and a plurality of contacts positioned at said first surface, said plurality of contacts for providing an electrical interface between the test head and the load board;
   means supporting said contactor for enabling the contactor freedom of motion to move with plural degrees of freedom so as to move within a first plane defined by the contactor relative to the test head and to move out of said first plane; and means for holding said plurality of contacts and said load board in physical contact to maintain said electrical interface;

wherein said first contactor may be laterally offset within said first plane by plus or minus one-quarter inch.

10. A test head for an integrated circuit test system which tests an integrated circuit device coupled to a load board, the test head comprising:

a contactor having a first surface and a plurality of contacts positioned at said first surface, said plurality of contacts for providing an electrical interface between the test head and the load board;

means supporting said contactor for enabling the contactor freedom of motion to move with plural degrees of freedom so as to move within a first plane defined by the contactor relative to the test head and to move out of said first plane; and means for holding said plurality of contacts and said load board in physical contact to maintain said electrical interface;

wherein said holding means comprises a means for generating a suction force at said contactor to hold said load board to said contactor.

11. A dual-sided test head for an integrated circuit test system which tests an integrated circuit device coupled to a load board, the test head comprising:

a first contactor at a first side of said test head for providing an electrical interface to a first load board and a second contactor at a second side of said test head providing an electrical interface to a second load board;

means supporting one of the first or second contactors for enabling said one contactor freedom of motion to move with plural degrees of freedom so as to move within an initial plane defined by said one contactor relative to the test head, and to move out of said initial plane; and means for simultaneously holding said first and second contactors to said first and second load boards, respectively.

12. The dual-sided test head of claim 11 in which said supporting means is a first supporting means and further comprising a second means for supporting the other of the first and second contactors for enabling said other contactor freedom of motion to move within a first plane defined by said other contactor relative to the test head, and to move out of said first plane.

13. The test head of claim 12 in which said holding means comprising a means for generating a suction force.

14. The test head of claim 12 in which said supporting means comprises a plurality of spring suspensors.

15. The test head of claim 12 in which said first and second supporting means enable said one and said other contactors, respectively, freedom of motion to rotate, tilt, offset laterally and offset vertically relative to said initial and first plane, respectively.

16. The test head of claim 12 in which said first supporting means allows said one contactor freedom of motion to move such that a point on said one contactor is movable within the bounds of a one-half inch diameter sphere centered at said point.

17. The test head of claim 12 in which said contactor may rotate within a seven degree angle of rotation.

18. The test head of claim 12 in which said other contactor may be offset within said first plane by plus or minus one-quarter inch.

19. The test head of claim 12 in which said other contactor may be tilted in any direction by three degrees.

20. The test head of claim 12 in which said other contactor may move out of said first plane plus or minus one-quarter inch parallel to said first plane.

* * * * *